(12) United States Patent
Wang et al.

(10) Patent No.: US 9,026,955 B1
(45) Date of Patent: May 5, 2015

(54) METHODOLOGY FOR PATTERN CORRECTION

(71) Applicant: Taiwan Semiconductor Manufacturing Co., Ltd., Hsin-Chu (TW)

(72) Inventors: Hung-Chun Wang, Taichung (TW); Ming-Hui Chih, Luzhou (TW); Ping-Chieh Wu, New Taipei (TW); Chun-Hung Wu, Hsinchu (TW); Feng-Ju Chang, Hsinchu (TW); Cheng-Kun Tsai, Hsinchu (TW); Wen-Chun Huang, Tainan (TW); Ru-Gun Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/051,568

(22) Filed: Oct. 11, 2013

(51) Int. Cl.
*G06F 17/50* (2006.01)

(52) U.S. Cl.
CPC .................................. *G06F 17/5081* (2013.01)

(58) Field of Classification Search
USPC .............................. 716/50, 51, 52, 53, 54, 55
See application file for complete search history.

(56) References Cited

U.S. PATENT DOCUMENTS

| | | | |
|---|---|---|---|
| 7,014,955 B2 * | 3/2006 | Chang et al. | 430/5 |
| 2007/0124718 A1 * | 5/2007 | Kobayashi et al. | 716/19 |
| 2007/0245284 A1 * | 10/2007 | Sinha et al. | 716/10 |
| 2009/0031261 A1 * | 1/2009 | Smith et al. | 716/2 |
| 2009/0049420 A1 | 2/2009 | Kobayashi | |
| 2009/0064083 A1 | 3/2009 | Ikeuchi | |
| 2009/0181314 A1 * | 7/2009 | Shyu et al. | 430/5 |
| 2011/0204470 A1 | 8/2011 | Cheng et al. | |
| 2011/0241207 A1 * | 10/2011 | Kuo et al. | 257/741 |
| 2013/0132918 A1 | 5/2013 | Ferguson et al. | |
| 2013/0246981 A1 * | 9/2013 | Chiang et al. | 716/53 |
| 2013/0326434 A1 * | 12/2013 | Feng | 716/52 |

OTHER PUBLICATIONS

U.S. Appl. No. 14/051,549, filed Oct. 11, 2013. 22 Pages.
Non Final Office Action Dated Oct. 9, 2014 U.S. Appl. No. 14/051,549.

* cited by examiner

*Primary Examiner* — Brian Ngo
(74) *Attorney, Agent, or Firm* — Eschweiler & Associates, LLC

(57) ABSTRACT

The present disclosure relates to a method of integrated chip (IC) design pattern correction that reduces pattern correction cycle time by separately correcting main feature shapes and dummy shapes of the IC design, and an associated apparatus. In some embodiments, the method is performed by forming an IC design having a plurality of main feature shapes. A plurality of dummy shapes are added to the IC design to improve a process window of the IC design. The plurality of main feature shapes are corrected using a first pattern correction process. One or more of the plurality of dummy shapes are subsequently corrected using a second pattern correction process separate from the first pattern correction process. By separately correcting dummy shapes and main feature shapes, the dummy shapes can be subjected to a different pattern correction process having lower time/resource demands, thereby reducing the pattern correction cycle time.

17 Claims, 5 Drawing Sheets

METHODOLOGY FOR PATTERN CORRECTION

The pattern density of an integrated chip (IC) design is a parameter that describes a concentration of a design level (e.g., a metal interconnect layer) within the design. For example, the pattern density of a metal layer within an IC design may be determined by dividing the area of the metal layer by the total area of the design. The pattern density of an IC design is carefully monitored during the design phase of integrated chip development. This is because the pattern density of an IC design impacts corresponding on-wafer structures.

For example, chemical mechanical polishing (CMP) processes used to planarize a substrate are sensitive to the pattern density of the substrate. In areas of the substrate where a pattern density of a metal layer is above the processing specifications of a CMP tool the substrate will dish, resulting in a non-planar substrate that can lead to defects and yield problems.

DETAILED DESCRIPTION

Figure 1:
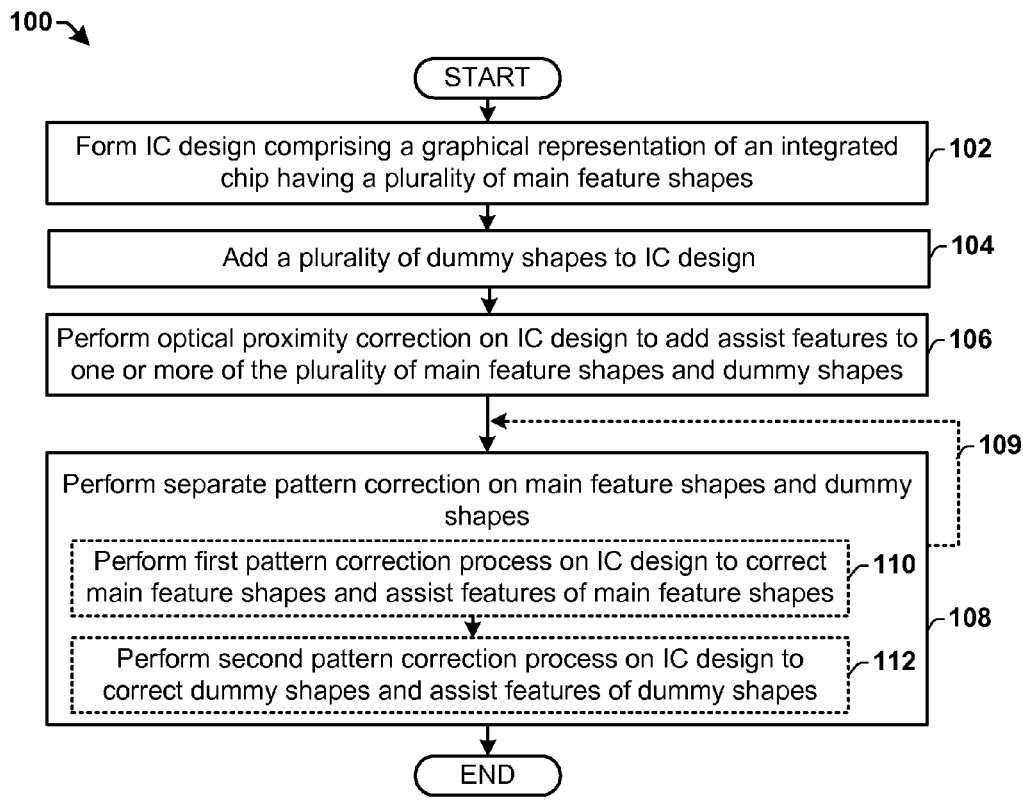
FIG. 1 illustrates a flow diagram of some embodiments of a method of pattern correction that separately operates upon (i.e., corrects) main feature shapes and dummy shapes.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Data preparation processes are automated processes that are used to modify design data so that an integrated chip (IC) design is accurately formed on a wafer. Data preparation processes may be used to introduce dummy shapes into an integrated chip (IC) design to control (e.g., vary) a pattern density of the IC design. The addition of such dummy shapes provides for a tight pattern density control that reduces defects and improves yield.

Typically, during a design process dummy shapes are added into an IC design having main feature shapes to improve pattern density of the design. The dummy shapes and the main features shapes are then subjected to a pattern correction process, which iteratively modifies the main feature shapes and the dummy shapes so that the IC design prints properly on wafer. It has been appreciated that as the size of IC features decrease (e.g., to 14 nm node, 10 nm node, etc.), such pattern correction processes consume a large number of development resources and drive a large pattern correction cycle time.

Accordingly, the present disclosure relates to a method of integrated chip (IC) design pattern correction that reduces pattern correction cycle time by separately operating upon (i.e., correcting) main feature shapes and dummy shapes of the IC design, and an associated apparatus. In some embodiments, the method comprises forming an integrated chip (IC) design comprising a graphical representation of an integrated chip having a plurality of main feature shapes. A plurality of dummy shapes are added to the IC design, wherein the plurality of dummy shapes are configured to improve the processing widow of the IC design. The plurality of main feature shapes are corrected using a first pattern correction process. One or more of the plurality of dummy shapes are subsequently corrected using a second pattern correction process that is separate from the first pattern correction process. By correcting dummy shapes separately from main feature shapes, the dummy shapes can be subjected to a different pattern correction process having lower time/resource demands, thereby reducing the overall pattern correction cycle time.

FIG. 1 illustrates a flow diagram of some embodiments of a method 100 of correcting patterns in an integrated chip design to improve the process window of the patterns. The method performs separate pattern correction processes upon main feature shapes and upon dummy shapes.

At 102, an integrated chip (IC) design comprising a graphical representation of an integrated chip is formed. The IC design comprises a plurality of main feature shapes corresponding to structures that are to be formed on an integrated chip.

At 104, a plurality of dummy shapes are added to the IC design. The plurality of dummy shapes are added to the IC design to improve a process window of the IC design by removing areas having a low pattern density that may cause processing hot spots that result in processing failures (e.g., defects, scumming, etc.).

At 106, an optical proximity correction (OPC) process may be performed on the IC design to improve the process window of the design. The OPC process is configured to add one or more assist features to one or more of the plurality of main feature shapes. The OPC process may also operate upon one or more of the plurality of dummy shapes to form opc'd dummy shapes.

At 108, separate pattern correction processes are performed upon main feature shapes and upon dummy shapes within the IC design. In some embodiments, the separate pattern correction processes comprise a first pattern correction process is performed on the IC design at 110, and a second pattern correction process is performed on the IC design at 112.

The first pattern correction process is configured to modify the shape of the main feature shapes and of assist features of the main feature shapes to improve the process window of the main feature shapes and of assist features of the main feature shapes (i.e., to make on-wafer shapes more closely correspond to the shapes in the IC design by accounting for changes in the design due to processing). For example, the first pattern correction process may be configured to correct a metal line and assist features (e.g., serifs or hammerheads) connected to the metal line. The second pattern correction process is configured to correct patterns of one or more of the plurality of dummy shapes and assist features of the one or more of the plurality of dummy shapes. For example, the second pattern correction process may be configured to correct a dummy shape and assist features connected to the dummy shape.

The separate pattern correction processes may be selectively performed in an iterative pattern correction process (as illustrated by line 109). In some embodiments, the first pattern correction process may comprise an iterative pattern correction process that performs a first number of iterations N to correct the main feature shapes and of assist features of the main feature shapes. In some embodiments, the second pattern correction process may comprise an iterative pattern correction process that performs a second number of iterations k (where k≤N) (e.g., a subset of the N iterations) to correct one or more dummy shapes and of assist features of the one or more dummy shapes.

For example, in some embodiments, the pattern correction process of act 108 may be performed for three (3) iterations. In a first iteration, pattern correction is performed on the main feature shapes and on assist features of the main feature shapes (act 110). In a second iteration, pattern correction is performed on the main feature shapes and on assist features of the main feature shapes (act 110). In a third iteration, pattern correction is performed on the main feature shapes, on assist features of the main feature shapes, on dummy features, and on dummy features of the main feature shapes (acts 110 and 112). In other embodiments, the pattern correction process of act 108 may be performed to perform pattern correction on the dummy features in other iterations (e.g., in a first and a third iteration, in a first iteration, etc.).

Therefore, method 100 corrects patterns of main feature shapes and associated assist features in a separate correction process than patterns of dummy features and associated assist features. By correcting dummy shapes separately than main feature shapes, the dummy shapes can be subjected to a different correction process having lower time/resource demands (e.g., less iterations), thereby reducing the overall pattern correction cycle time.

FIGS. 2-6 illustrate some embodiments of an integrated chip design upon which a method of pattern correction is performed. Although FIGS. 2-6 are described in relation to method 100, it will be appreciated that the structures disclosed in FIGS. 2-6 are not limited to such a method.

Figure 2:
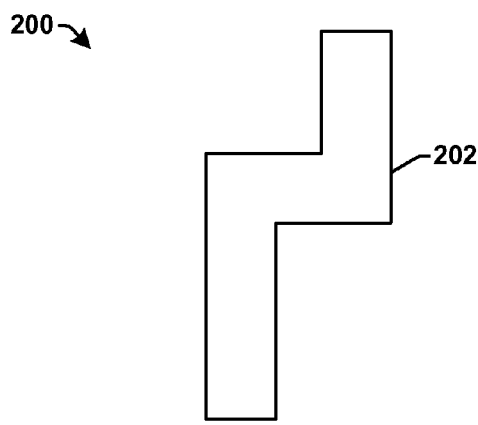
FIGS. 2-6 illustrate some embodiments of an integrated chip design upon which a method of pattern correction is performed.

FIG. 2 illustrates some embodiments of a top-view corresponding to act 102. The top-view shows an integrated chip (IC) design 200 comprising a graphical representation of an integrated chip. The IC design 200 comprises a main feature shape 202. In some embodiments, the IC design 200 may be formed by a designer using a design software program. In other embodiments, the IC design 200 may be formed by an automatic place and route tool configured to automatically place the main feature shape 202 within the IC design 200.

In some embodiments, the main feature shape 202 may comprise a metal interconnect shape. For example, the main feature shape 202 may comprise a metal shape on a first back-end-of-the-line (BEOL) metal layer. In some embodiments, the IC design 200 may comprise a Graphic Database System (GDS) file, such as a GDS or GDSII file. In other embodiments, the IC design 200 may comprise a CIF file, an OASIS file, or some other similar file format, for example.

Figure 3:
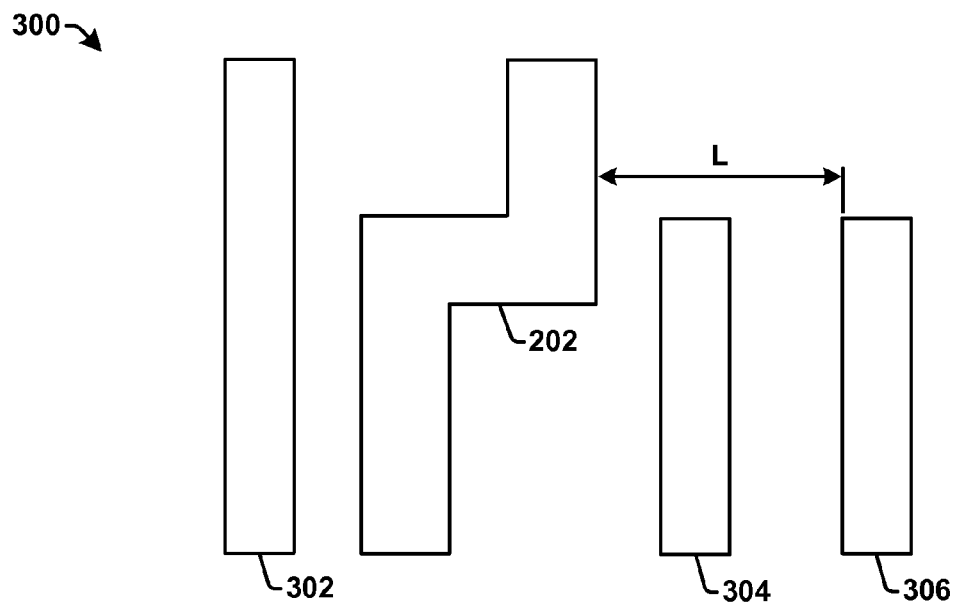

FIG. 3 illustrates some embodiments of a top-view 300 corresponding to act 104. As shown in top-view 300, a plurality of dummy shapes 302-306 may be added to the IC design. The plurality of dummy shapes 302-306 are configured to eliminate areas of the IC design having a low pattern density that may cause processing hot spots that result in processing failures. In some embodiments, the plurality of dummy shapes 302-306 are added to low-pattern-density areas having a pattern density falling outside of an optimum operating value of a processing tool (e.g., a CMP tool) defined by one or more pre-determined threshold values.

Figure 4:
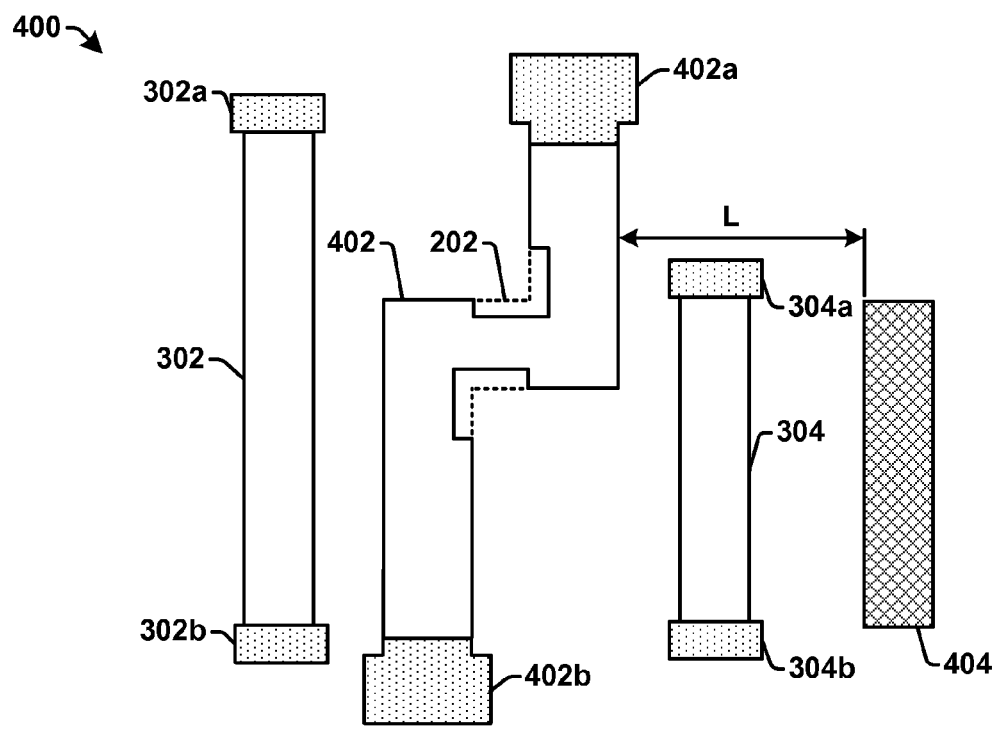

FIG. 4 illustrates some embodiments of a top-view 400 corresponding to act 106. As shown in top-view 400, an OPC process is performed on the IC design. The OPC process is configured to selectively add assist features (302a, 302b, 304a, 304b, 402a and 402b) to the main feature shape 202 and to one or more of the plurality of dummy shapes, 302 and 304. For example, as shown in top-view 400, an OPC process operates upon main feature shape 202 to form an opc'd main feature shape 402 having assist features 402a and 402b. The OPC process also operates upon dummy shapes 302 and 304 to form opc'd dummy shapes having assist features 302a and 302b and assist features 304a and 304, respectively. The assist features (302a, 302b, 304a, 304b, 402a and 402b) are configured to improve the process window of opc'd main feature shape 402 and dummy shapes 302 and 304, thereby allowing for on-wafer shapes to more closely correspond to the IC design 200.

In some embodiments, the OPC process is configured to operate upon a subset of the plurality of dummy shapes so as to form opc'd dummy shapes having associated assist features and non-opc'd dummy shapes not having associated assist features. In some embodiments, the OPC process is selectively performed on one or more dummy shapes depending on a location of the dummy shapes relative to a main feature shape. In some embodiments, dummy shapes having a distance greater than L (e.g., where L is greater than approximately 100 microns) from a main feature shape 202 may not be operated upon by an OPC process. For example, as shown in top-view 400, an OPC process may operate upon dummy shapes, 302 and 304, that are within a certain distance of a main feature shape 202 to form opc'd dummy shapes (i.e., a dummy shape having assist features), while the OPC process may not operate upon dummy shape 306 outside of the certain distance of the main feature shape 202 so as to result in a non-opc'd dummy shape (i.e., a dummy shape having no assist features). In other embodiments, the OPC process may be selectively performed on one or more dummy shapes depending on other criteria.

Figure 5:
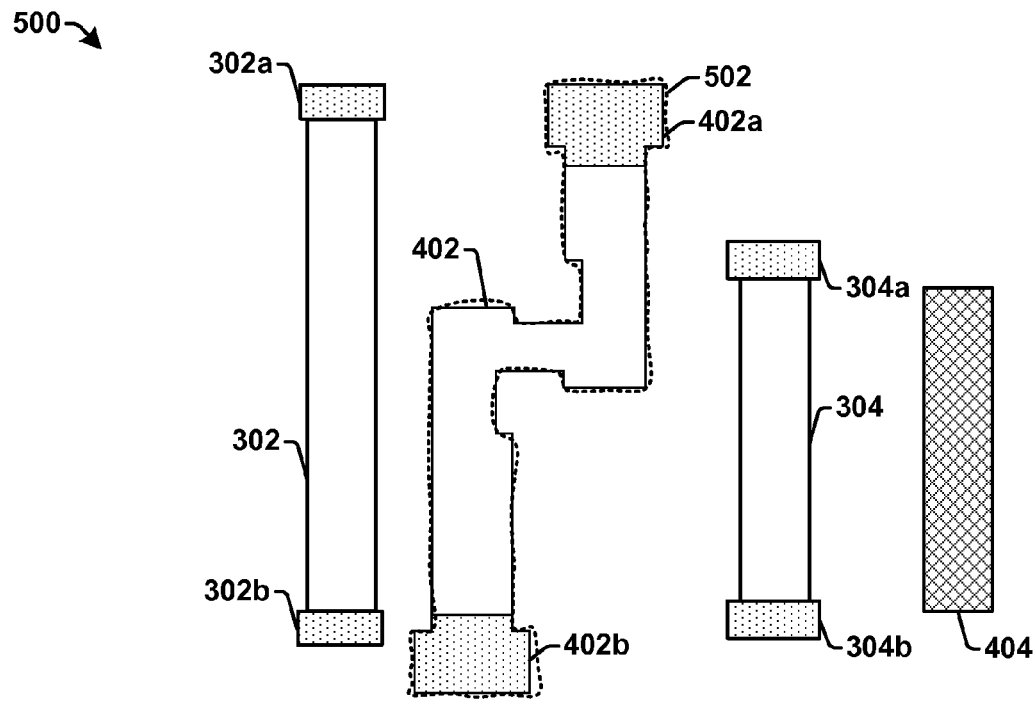

FIG. 5 illustrates some embodiments of a top-view 500 corresponding to act 108. As shown in top-view 500, a first pattern correction process is performed on the opc'd main feature shape 402 and on associated assist features 402a and 402b. The first pattern correction process may use models and/or simulations to simulate what the opc'd main feature shape 402 and associated assist features 402a and 402b will look like on-wafer and then adjust (e.g., vary an edge, extend a shape, etc.) the opc'd main feature shape 402 and associated assist features 402a and 402b to achieve a desired result. For example, as shown in top-view 500, opc'd main feature shape 402 and assist features 402a and 402b are modified to form pattern corrected main feature shape 502.

Figure 6:
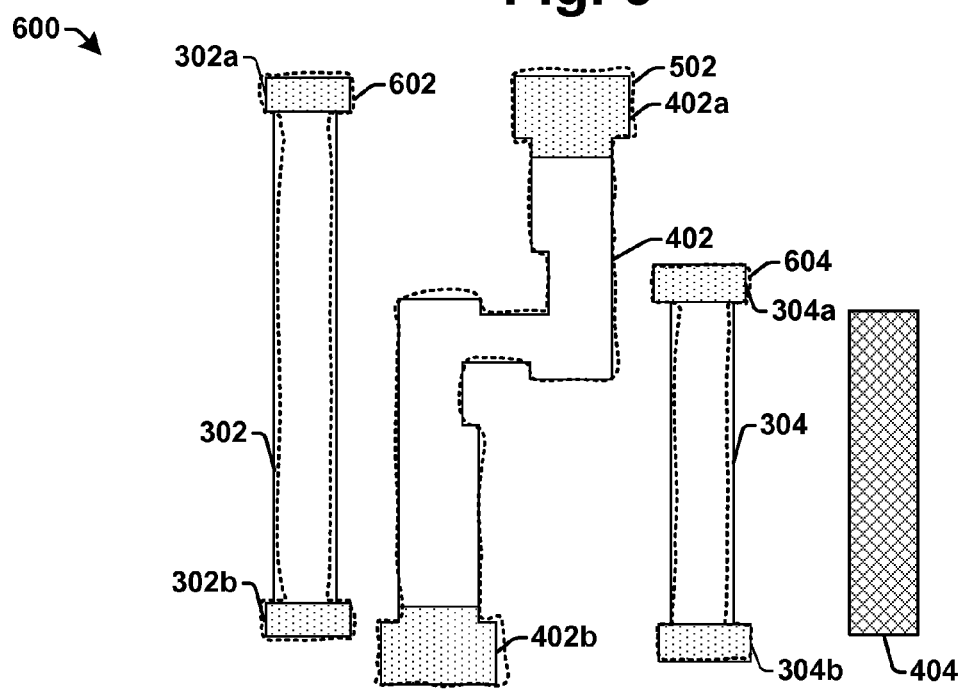

FIG. 6 illustrates some embodiments of a top-view 600 corresponding to act 110. As shown in top-view 600, a second pattern correction process is performed on the dummy shapes, 302 and 304, and on associated assist features 302a, 302b, 304a, and 304b. The second pattern correction process may use models and/or simulations to simulate what the dummy shapes, 302 and 304, and associated assist features, 302a, 302b, 304a, and 304b will look like on-wafer and then adjust (e.g., vary an edge, extend a shape, etc.) the dummy shapes, 302 and 304, and associated assist features, 302a, 302b, 304a, and 304b to achieve a desired result. For example, as shown in top-view 600, dummy shape 302 and assist features 302a and 302b are modified to form pattern corrected dummy shape 602, and dummy shape 304 and assist features 304a and 304b are modified to form pattern corrected dummy shape 604.

In some embodiments, the second pattern correction process is performed on opc'd dummy shapes (i.e., dummy shapes having assist features) but not on non-opc'd dummy shapes (i.e., dummy shapes not having assist features). For example, as shown in top-view 600, opc'd dummy shapes, 302 and 304, are modified by the second pattern correction process to form a pattern corrected dummy shapes, 602 and 604, but non-opc'd dummy shape 306 is not modified by the second pattern correction process.

In some embodiments, the first pattern correction process and the second pattern correction process may comprise iterative processes, wherein the first and second iterative processes comprise a different number of iterations. In some embodiments, during iterations of the first pattern correction process an iterative correction is made to the opc'd main feature shape 402 and associated assist features, 402a and 402b. In some embodiments, during iterations of the second pattern correction process an iterative correction is made to dummy shapes, 302 and 304, and associated assist features, 302a, 302b, 304a, and 304b.

In some embodiments, the first pattern correction process may be configured to perform N (e.g., N=11) iterations, while the second pattern correction process may be configured to perform k≤N (e.g., k=5 iterations). In some embodiments, the first pattern correction process may make corrections to opc'd main feature shape 402 and associated assist features, 402a and 402b during iterations 1-11, while the second pattern correction process may make corrections to dummy shapes, 302 and 304, and associated assist features, 302a, 302b, 304a, and 304b during iterations 6-11.

It will be appreciated that corrections of the first and second pattern correction processes may be made in any order. For example, in some embodiments, during iterations 1-5 the first pattern correction process is operated, while during iterations 6-11 the second pattern correction process is operated. In other embodiments, during iterations 1, 3, 5, 7, 9, and 11 the first pattern correction process is operated, while during iterations 2, 4, 6, 8, and 10 the second pattern correction process is operated.

Figure 7:
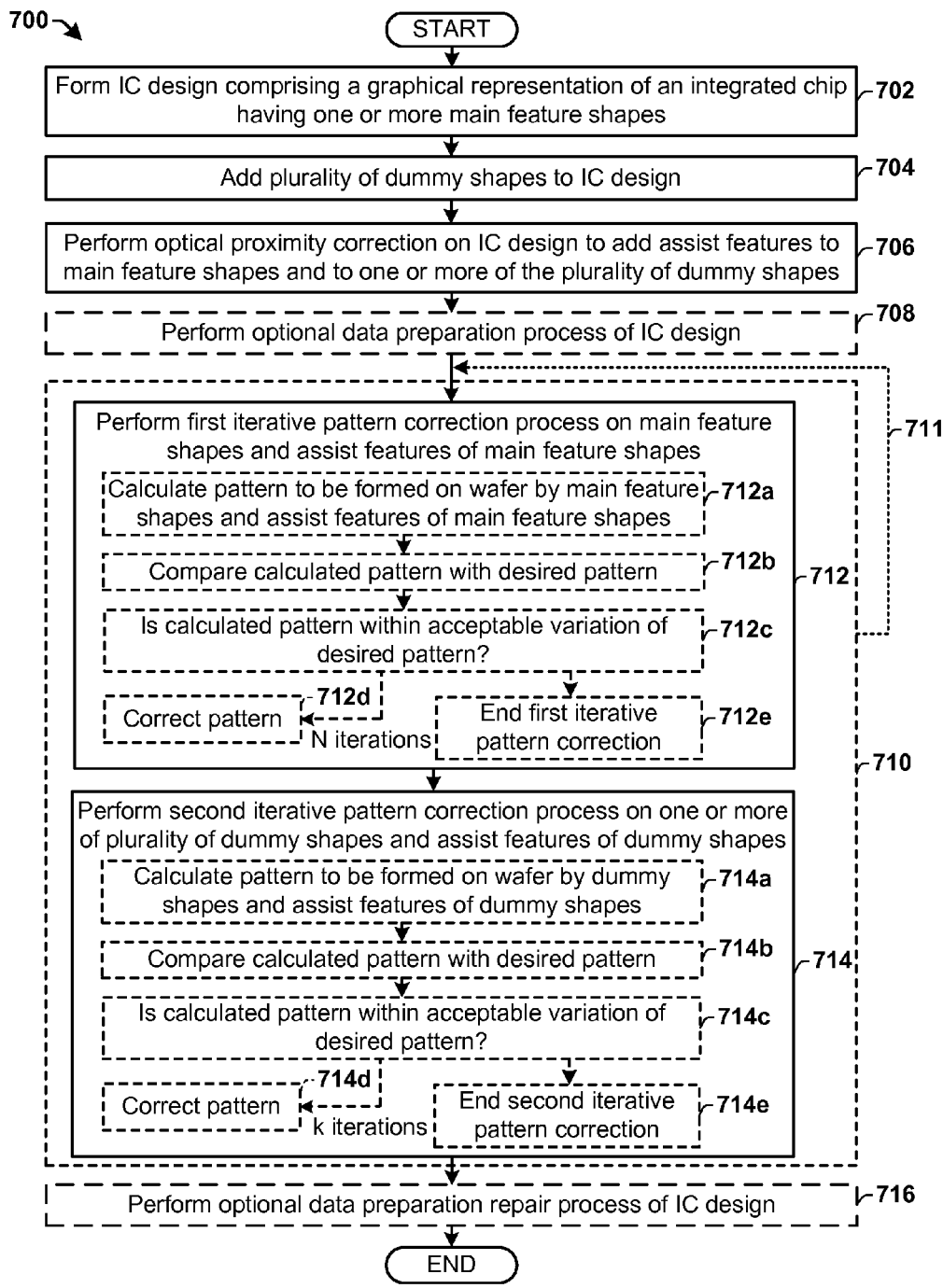
FIG. 7 illustrates a flow diagram of some alternative embodiments of a method of pattern correction.

FIG. 7 illustrates a flow diagram of some alternative embodiments of a method 700 of pattern correction of an integrated chip (IC) design.

While disclosed methods (e.g., methods 100 and 700) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, an integrated chip (IC) design comprising a graphical representation of an integrated chip is formed. The IC design comprises a plurality of main feature shapes corresponding to structures that are to be formed on an integrated chip.

At 704, a plurality of dummy shapes are added to the IC design. The plurality of dummy shapes are added to the IC design to remove areas having a low pattern density that may causes processing hot spots that result in processing failures. In some embodiments, the plurality of dummy shapes may be added into low-pattern-density areas have a pattern density falling outside of an optimum operating value of a processing tool defined by one or more pre-determined threshold values. For example, in some embodiments, the plurality of dummy shapes may be added into a low-pattern-density area having a pattern density less than a predetermined threshold of 25%, which may result in dishing during a chemical mechanical polishing (CMP) process.

At 706, an optical proximity correction (OPC) process is performed on the IC design. The OPC process modifies one or more of the main shapes and one or more of the dummy shapes in the IC design to improve the process window of the IC design (i.e., to make on-wafer shapes more closely correspond to the shapes in the IC design by accounting for changes in the design due to processing).

At 708, an optional data preparation process may be performed on the IC design, in some embodiments. The optional data preparation process may be configured to operate upon one or more shapes (e.g., dummy shapes and/or main feature shapes) within the IC design. Operating upon the shapes prior to pattern correction (acts 710 and 712) may reduce faults in the IC design, thereby simplifying the pattern correction (e.g., reducing the number of iterations of pattern correction performed) and reducing pattern correction cycle time.

In some embodiments, the optional data preparation process may comprise rule based modifications. For example, the rule based data modifications may move the edges of a shape within the IC design using a rule based criteria. In other embodiments, the optional data preparation process may add lithographic assist features to the IC design. The lithographic assist features comprise features added around a shape to enhance the lithographic window of the shape.

At 710, separate pattern correction processes are performed upon main feature shapes and upon dummy shapes within the IC design. In some embodiments, the separate pattern correction processes are selectively performed within one or more of a plurality of iterations (as shown by line 711) of the pattern correction processes. For example, main feature shapes may be corrected in the plurality of iterations, while dummy shapes may be corrected in a subset of the plurality of iterations.

In some embodiments, performing the separate pattern correction processes comprises performing a first pattern correction process on the IC design, at 712. The first pattern correction process is configured to correct patterns of the main feature shapes and of assist features of the main feature shapes. In some embodiments, the first pattern correction process is configured to calculate (e.g., simulate) patterns to be formed on wafer by main feature shapes and assist features of the main feature shapes, at 712a. The calculated pattern is compared with a desired pattern (e.g., a designed pattern), at 712b. If the calculated pattern is within an acceptable variation of a desired pattern (712c) the first pattern correction process ends, at 712e. However, if the calculated pattern is not within an acceptable variation of a desired pattern (712c) the pattern is corrected in an iterative process that may extend over N iterations (712d).

In some embodiments, performing the separate pattern correction processes further comprises performing a second pattern correction process on the IC design at 714. The second pattern correction process is configured to correct patterns of one or more of the plurality of dummy shapes and assist features of the one or more of the plurality of dummy shapes. In some embodiments, the second pattern correction process is configured to calculate (e.g., simulate) patterns to be formed on wafer by dummy shapes and assist features of the dummy shapes, at 714a. The calculated pattern is compared with a desired pattern (e.g., a designed pattern), at 714b. If the calculated pattern is within an acceptable variation of a desired pattern (714c) the first pattern correction process ends, at 714e. However, if the calculated pattern is not within an acceptable variation of a desired pattern (714c) the pattern is corrected in an iterative process that may extend over k iterations, where k<N, at 714d.

At 716, an optional data preparation repair process may be performed on the IC design, in some embodiments. The optional data preparation repair process may be configured to mitigate any remaining process window problems. For example, if a local area within the IC design is still found to have process window issues after the first and second pattern correction processes, the optional data preparation repair process will modify the local area to correct the process window problem.

Figure 8:
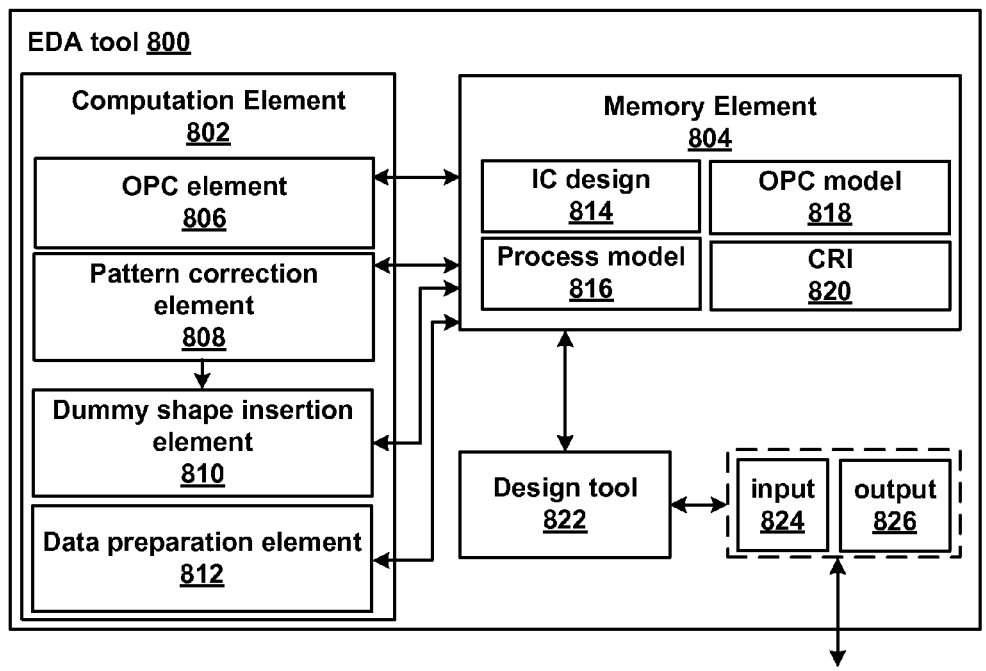
FIG. 8 illustrates a block diagram of some embodiments of an EDA (Electronic design automation) tool configured to execute the disclosed method of pattern correction.

FIG. 8 illustrates a block diagram of some embodiments of an EDA (Electronic design automation) tool 800 configured to execute the disclosed method of pattern correction.

The EDA tool 800 comprises a computation element 802 and a memory element 804. The computation element 802 comprises an OPC element 806, a pattern correction element 808, and a dummy shape insertion element 810, and a data preparation element 812. The memory element 804 is configured to store an integrated chip (IC) design 814 (e.g., a GDS or GDSII file, a CIF file, or an OASIS file), a process model 816, an OPC (optical proximity correction) model 818, and computer readable instructions (CRI) 820 may provide for a method of operating one or more components of the EDA tool according to a disclosed method (e.g., method 100 and/or 700). In various embodiments, the memory element 804 may comprise an internal memory or a computer readable medium.

The dummy shape insertion element 810 is configured to insert dummy shapes into the low-pattern-density areas of the IC design 814. The plurality of dummy shapes are configured to improve a process window of the IC design 814.

The OPC element 806 is configured to selectively access the OPC model 818 to add one or more assist features to shapes within the IC design 814. For example, the OPC element 806 may add assist features to dummy shapes and/or to main feature shapes within the IC design 814.

The pattern correction element 808 is configured to access the process model 816 to simulate main feature shapes and dummy shapes of the IC design. Based upon the simulation, the pattern correction element 808 is further configured to operate upon the dummy shapes in the IC design 814 with a first pattern correction process, and to operate upon the main feature shapes in the IC design 814 with a second pattern correction process separate from the first pattern correction process.

The data preparation element 812 may be configured to perform a rule based data preparation process on the IC design 814 prior to the pattern correction element 808 performing the first pattern correction process and the second pattern correction process.

In some embodiments, the pattern correction element 808 comprises a simulation element, a comparison element, and an adjustment element. The simulation element is configured to simulate a pattern to be formed on a wafer based upon the plurality of main feature shapes and/or one or more of the plurality of dummy shapes. The comparison element is configured to compare the simulated pattern with a desired pattern. The adjustment element is configured to adjust one or more of the plurality of main feature shapes and/or one or more of the plurality of dummy shapes if the pattern is not within an acceptable variation of the desired pattern.

The EDA tool 800 further comprises a design tool 822 configured to generate the IC design 814. In some embodiments, the design tool 822 may comprise an automatic place and route tool configured to selectively route shapes on a plurality of design levels to generate the IC design 814. In other embodiments, the design tool 822 may comprise a user interactive design environment that allows for designers to generate the IC design 814. In such embodiments, the EDA tool 800 may comprise an input device 824 and/or an output device 826. The input device 824 is configured to allow a user to interact with the IC design 814 and in various embodiments may comprise a keyboard, mouse, and/or any other input device. The output device 826 is configured to provide a graphical representation of the IC design 814 that can be viewed by a user. In various embodiments, the output device 826 may comprise a monitor, for example.

It will be appreciated that while reference is made throughout this document to exemplary structures in discussing aspects of methodologies described herein (e.g., the IC design presented in FIGS. 2-6, while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of integrated chip (IC) design pattern correction that reduces pattern correction cycle time by separately operating upon (i.e., correcting) main feature shapes and dummy shapes of the IC design, and an associated apparatus.

In some embodiments, the present disclosure relates to a method for pattern correction of an integrated chip design. The method comprises forming an integrated chip (IC) design comprising a graphical representation of an integrated chip having a plurality of main feature shapes. The method further comprises adding a plurality of dummy shapes to the IC design, wherein the plurality of dummy shapes are configured to improve a process window of the IC design. The method further comprises operating upon one or more of the plurality of main feature shapes with a first pattern correction process. The method further comprises operating upon one or more of the plurality of dummy shapes with a second pattern correction process separate from the first pattern correction process.

In other embodiments, the present disclosure relates to a method for pattern correction of an integrated chip design. The method comprises forming an integrated chip (IC) design comprising a graphical representation of an integrated chip having a plurality of main feature shapes. The method further comprises adding a plurality of dummy shapes to the IC design, wherein the plurality of dummy shapes are configured to improve a process window of the IC design. The method further comprises performing an optical proximity correction (OPC) process to add assist features to one or more of the plurality of main feature shapes and to one or more of the plurality of dummy shapes. The method further comprises performing a first iterative pattern correction process to correct the plurality of main feature shapes and the assist features of the plurality of main feature shapes over a first number of iterations, and performing a second iterative pattern correction process to correct the one or more of the plurality of dummy shapes and for assist features of the one or more of the plurality of dummy shapes over a second number of iterations.

In yet other embodiments, the present disclosure relates to an EDA (Electronic design automation) tool. The EDA tool comprises a design tool configured to form an integrated chip (IC) design comprising a graphical representation of an integrated chip having a plurality of main feature shapes. The EDA tool further comprises a dummy shape insertion element configured to add a plurality of dummy shapes to the IC design, wherein the plurality of dummy shapes are configured to improve a process window of the IC design. The EDA tool further comprises a pattern correction element configured to operate upon one or more of the plurality of dummy shapes with a first pattern correction process, and to operate upon one or more of the plurality of main feature shapes with a second pattern correction process separate from the first pattern correction process.

What is claimed is:

1. A method for pattern correction of an integrated chip design, comprising:
    forming an integrated chip (IC) design comprising a graphical representation of an integrated chip having a plurality of main feature shapes;
    adding a plurality of dummy shapes to the IC design, wherein the plurality of dummy shapes are configured to improve a process window of the IC design;
    performing an optical proximity correction (OPC) process on the IC design to add assist features to one or more of the plurality of main feature shapes, and on a subset of the plurality of dummy shapes so as to form opc'd dummy shapes having associated assist features and non-opc'd dummy shapes not having associated assist features;
    operating upon one or more of the plurality of main feature shapes and assist features of the main feature shapes with a first pattern correction process; and
    operating upon one or more of the plurality of dummy shapes and on assist features of the dummy shapes with a second pattern correction process separate from the first pattern correction process;
    wherein a computer is used to form the IC design, add the plurality of dummy shapes to the IC design, operate with the first pattern correction process, or operate with the second pattern correction process.

2. The method of claim 1, wherein the second pattern correction process is configured to operate upon opc'd dummy shapes and not to operate upon non-opc'd dummy shapes.

3. The method of claim 1,
    wherein the first pattern correction process comprises a first iterative process configured to correct the one or more of the plurality of main feature shapes over a first number of iterations; and
    wherein the second pattern correction process comprises a second iterative process configured to correct the one or more of the plurality of dummy shapes over a second number of iterations, wherein the second number of iterations is less than the first number of iterations.

4. The method of claim 1, further comprising:
    performing a rule based data preparation process on the IC design prior to the first pattern correction process and the second pattern correction process.

5. The method of claim 1, wherein the first pattern correction process comprises:
    simulating a pattern to be formed on a wafer based upon the plurality of main feature shapes;
    comparing the pattern with a desired pattern; and
    adjusting one or more of the plurality of main feature shapes if the pattern is not within an acceptable variation of the desired pattern.

6. The method of claim 1, wherein the IC design comprises a GDSII file or an OASIS file.

7. A method for pattern correction, comprising:
    forming an integrated chip (IC) design comprising a graphical representation of an integrated chip having a plurality of main feature shapes;
    adding a plurality of dummy shapes to the IC design, wherein the plurality of dummy shapes are configured to improve a process window of the IC design;
    performing an optical proximity correction (OPC) process to add assist features to one or more of the plurality of main feature shapes and to one or more of the plurality of dummy shapes;
    performing a first iterative pattern correction process to correct the plurality of main feature shapes and the assist features of the plurality of main feature shapes over a first number of iterations; and
    performing a second iterative pattern correction process to correct the one or more of the plurality of dummy shapes and for assist features of the one or more of the plurality of dummy shapes over a second number of iterations;
    wherein a computer is used to form the IC design, add the plurality of dummy shapes to the IC design, perform the OPC process, perform the first iterative pattern correction process, or perform the second iterative pattern correction process.

8. The method of claim 7, wherein the second number of iterations is less than the second number of iterations.

9. The method of claim 7, further comprising:
    performing a rule based data preparation process on the IC design prior to the first pattern correction process and the second pattern correction process.

10. The method of claim 7, wherein the second pattern correction process is configured to operate upon opc'd dummy shapes and not to operate upon non-opc'd dummy shapes.

11. The method of claim 7, wherein the first pattern correction process comprises:
    simulating a pattern to be formed on a wafer based upon the plurality of main feature shapes;
    comparing the pattern with a desired pattern; and
    adjusting one or more of the plurality of main feature shapes if the pattern is not within an acceptable variation of the desired pattern.

12. The method of claim 7, wherein the IC design comprises a GDSII file or an OASIS file.

13. An EDA (Electronic design automation) tool disposed within a computer readable storage device, comprising:
- a design tool configured to form an integrated chip (IC) design comprising a graphical representation of an integrated chip having a plurality of main feature shapes;
- a dummy shape insertion element configured to add a plurality of dummy shapes to the IC design, wherein the plurality of dummy shapes are configured to improve a process window of the IC design; and
- a pattern correction element configured to operate upon one or more of the plurality of dummy shapes with a first pattern correction process, and to operate upon one or more of the plurality of main feature shapes with a second pattern correction process separate from the first pattern correction process;
- wherein the first pattern correction process comprises a first iterative process configured to correct the one or more of the plurality of main feature shapes over a first number of iterations;
- wherein the second pattern correction process comprises a second iterative process configured to correct the one or more of the plurality of dummy shapes over a second number of iterations, wherein the second number of iterations is less than the first number of iterations.

14. The EDA tool of claim 13, further comprising:
- a optical proximity correction (OPC) element configured to perform an OPC process on the IC design to add assist features to one or more of the plurality of main feature shapes and to one or more of the plurality of dummy shapes;
- wherein the first pattern correction process further operates upon assist features of the one or more dummy shapes; and
- wherein the second pattern correction process further operates upon assist features of the one or more main feature shapes.

15. The EDA tool of claim 14,
- wherein the OPC process is configured to operate upon a subset of the plurality of dummy shapes so as to form opc'd dummy shapes having associated assist features and non-opc'd dummy shapes not having associated assist features; and
- wherein the second pattern correction process is configured to operate upon opc'd dummy shapes and not to operate upon non-opc'd dummy shapes.

16. The EDA tool of claim 13, wherein the pattern correction element, comprises:
- a simulation element configured to simulate a pattern to be formed on a wafer based upon the plurality of main feature shapes or the one or more of the plurality of dummy shapes;
- a comparison element configured to compare the pattern with a desired pattern; and
- an adjustment element configured to adjust one or more of the plurality of main feature shapes or one or more of the plurality of dummy shapes if the pattern is not within an acceptable variation of the desired pattern.

17. The EDA tool of claim 16, further comprising:
- a data preparation element configured to perform a rule based data preparation process on the IC design prior to the first pattern correction process and the second pattern correction process.

* * * * *